United States Patent
Li

(10) Patent No.: US 9,978,749 B2
(45) Date of Patent: May 22, 2018

(54) METHOD TO IMPROVE DEVICE PERFORMANCE FOR FINFET

(71) Applicant: SEMICONDUCTOR MANUFACTURING INTERNATIONAL (SHANGHAI) CORPORATION, Shanghai (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days. days.

(21) Appl. No.: 15/292,086

(22) Filed: Oct. 12, 2016

(65) Prior Publication Data

US 2017/0221892 A1  Aug. 3, 2017

(30) Foreign Application Priority Data

Feb. 2, 2016  (CN) .......................... 2016 1 0073062

(51) Int. Cl.
| | |
|---|---|
| *H01L 29/165* | (2006.01) |
| *H01L 21/8234* | (2006.01) |
| *H01L 21/324* | (2006.01) |
| *H01L 27/088* | (2006.01) |
| *H01L 29/06* | (2006.01) |
| *H01L 21/8238* | (2006.01) |
| *H01L 29/66* | (2006.01) |

(Continued)

(52) U.S. Cl.
CPC ........ *H01L 27/0886* (2013.01); *H01L 21/324* (2013.01); *H01L 21/823431* (2013.01); *H01L 21/823821* (2013.01); *H01L 27/0924* (2013.01); *H01L 29/0657* (2013.01); *H01L 29/165* (2013.01); *H01L 29/66795* (2013.01); *H01L 29/785* (2013.01); *H01L 29/7848* (2013.01)

(58) Field of Classification Search
CPC ............... H01L 27/0886; H01L 21/324; H01L 21/823431; H01L 29/0657; H01L 29/165
USPC ......................................... 257/401; 438/283
See application file for complete search history.

(56) References Cited

U.S. PATENT DOCUMENTS

| | | | |
|---|---|---|---|
| 9,324,623 B1* | 4/2016 | Kim .................. | H01L 21/82381 |
| 2014/0103451 A1* | 4/2014 | Ouyang .............. | H01L 21/8234 257/401 |

(Continued)

*Primary Examiner* — Cuong Q Nguyen
*Assistant Examiner* — Tong-Ho Kim

(57) ABSTRACT

A method includes providing a semiconductor structure comprising multiple fins and a gate structure on the fins. The method also includes removing a portion of the fins not covered by the gate structure to form a remaining portion of the fins, performing a first epitaxially growth process to form first epitaxially grown regions on the remaining portion of the fins, performing a first annealing process so that an upper portion of the first epitaxially grown regions is greater than a lower portion, performing a second epitaxially growth process on the annealed first epitaxially grown regions to form second epitaxially grown regions, and performing a second annealing process on the second epitaxially grown regions, so that an upper portion of the second epitaxially grown regions is greater than a lower portion. The second epitaxially grown regions are separated from each other before and after the second annealing process.

20 Claims, 13 Drawing Sheets

(51) Int. Cl.
*H01L 29/78* (2006.01)
*H01L 27/092* (2006.01)

(56) References Cited

U.S. PATENT DOCUMENTS

2015/0303118 A1* 10/2015 Wang ................ H01L 21/82348
                                                        257/401
2016/0099342 A1*  4/2016 Basker ................ H01L 27/0924
                                                        438/283

* cited by examiner

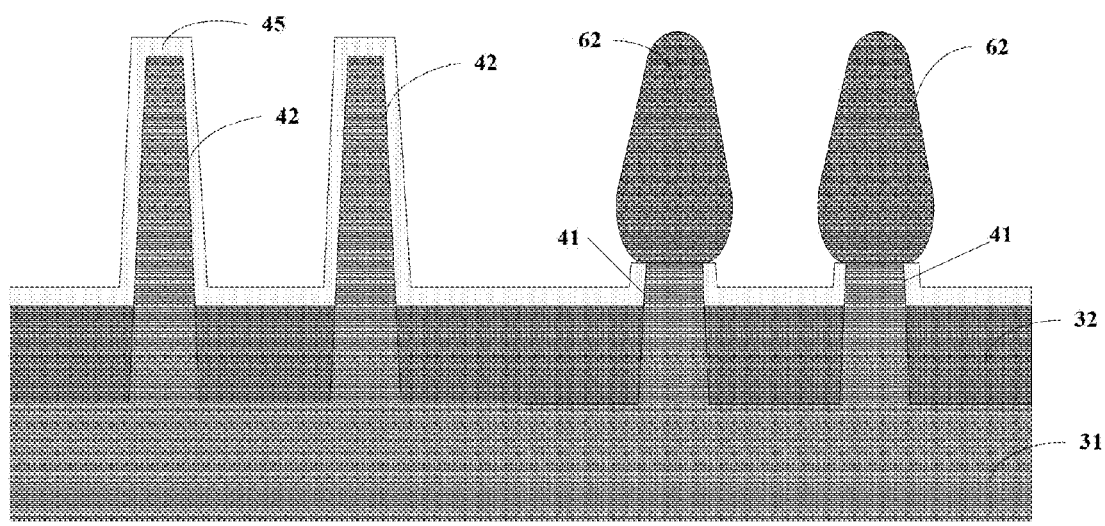
FIG. 3G
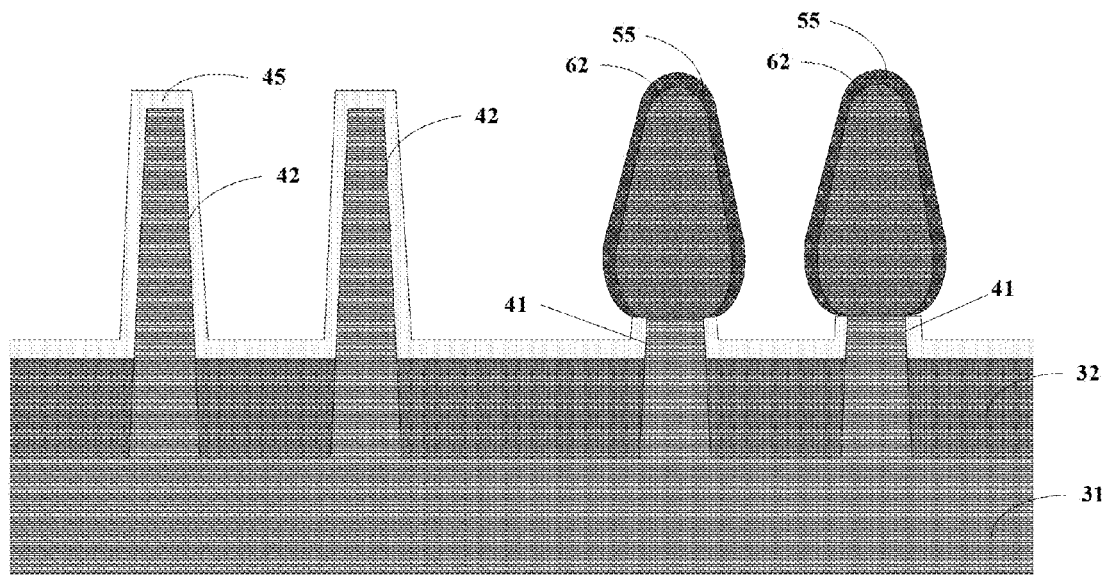
FIG. 3H1

FIG. 3H2

METHOD TO IMPROVE DEVICE PERFORMANCE FOR FINFET

CROSS-REFERENCES TO RELATED APPLICATIONS

This application claims priority to Chinese patent application No. 201610073062.4, filed on Feb. 2, 2016, the content of which is incorporated herein by reference in its entirety.

BACKGROUND OF THE INVENTION

Embodiments of the disclosure relate to the field of semiconductor device fabrication. In particular, embodiments of the disclosure relate to a fin field effect transistor semiconductor device having a fingertip-shaped source or drain structure and method for manufacturing the same.

With the continuous development of fin field effect transistor (FinFET) devices, the parasitic external resistance has become a more dominant component at advanced technology nodes. The parasitic external resistance is due mainly to the contact resistance between the silicide and silicon in the source or drain region.

Most metals cause a strong Fermi level pinning effect, so that the position of the Fermi level is close to the middle of the silicon band gap, leading to a relatively high Schottky barrier height. As a result, the contact resistance increases. Due to the Fermi level pinning effect, it is difficult to reduce the Schottky barrier height. Equation (1) below shows the relationship between the contact resistance and the Schottky barrier height:

$$\rho_c \propto \exp\left[\frac{2\sqrt{\varepsilon_r m^*}}{q\hbar}\left(\frac{\phi_{Bn}}{\sqrt{N_D}}\right)\right] \quad (1)$$

where $\rho_c$ is the contact resistance between the silicide and silicon in the source/drain region, $\Phi_{Bn}$ is the Schottky barrier height, $N_D$ is N-type dopant concentration, $\varepsilon_r$ is the relative permittivity, $m^*$ is the electron effective mass, $\hbar$ is the Planck's constant, and q is the electron charge.

According to the prior art, the silicide layer in the source or drain region of the fin is the contact element. The following two cases may occur when forming the contact element:

1) silicide layers of adjacent source or drain regions may be joined together, so that the joined contact element has a relatively small area and the stress effect is reduced.

2) silicide layers of adjacent source or drain regions may not be joined together, but the volume of the epitaxial silicide layers is relatively small, the stress effect of the contact element may not be apparent, the surface of the contact element may have a polygonal shape, however, the surface area of the contact element is not sufficiently large, and the resistance of the contact element may be relatively large.

Thus, there is a need for methods for manufacturing a semiconductor device and a semiconductor device fabricated using such methods to solve the problems stated above.

BRIEF SUMMARY OF THE INVENTION

The present inventor discovered metals may cause a strong Fermi level pinning effect, so that the position of the Fermi level is close to the middle of the silicon band gap. This results in a relatively large Schottky barrier height and an increase in the contact resistance. Therefore, the present inventor provides a novel method for manufacturing a semiconductor device. The thus manufactured semiconductor device has a large stress effect and reduced contact resistance.

According to some embodiments of the present invention, a method for manufacturing a semiconductor device may include providing a semiconductor structure comprising a substrate structure having a semiconductor substrate, a multitude of fins comprising a semiconductor layer extending into the semiconductor substrate and a first set of fins configured to form a plurality of first type devices, and a gate structure disposed on the fins. The method also includes removing a portion of each of the first set of fins not covered by the gate structure to form a remaining portion of each of the first set of fins, performing a first epitaxially growth process to form a plurality of first epitaxially grown regions on the remaining portion of each of the first set of fins, performing a first annealing process so that a volume of an upper portion of each of the first epitaxially grown regions increases and a volume of a lower portion of each of the first epitaxially grown regions decreases, the first epitaxially grown regions are separated from each other before and after the first annealing process. The method further includes performing a second epitaxially growth process to form a plurality of second epitaxially grown regions on corresponding annealed first epitaxially grown regions, and performing a second annealing process so that a volume of an upper portion of each of the second epitaxially grown regions increases and a volume of a lower portion of each of the second epitaxially grown regions decreases. The second epitaxially grown regions are separated from each other before and after the second annealing process.

In an embodiment, the substrate structure includes an insulating layer on the semiconductor substrate, and the fins protrude from the insulating layer.

In an embodiment, removing the portion of each of the fins includes forming a patterned mask exposing the portion of the fins not covered by the gate structure, and removing the exposed portion by etching using the patterned mask as an etching mask.

In an embodiment, the first annealing process is performed in situ in a hydrogen atmosphere, at a temperature in a range between 700° C. and 800° C., and a time period in a range between 5 minutes and 30 minutes. In an embodiment, the second annealing process is performed in situ in a hydrogen atmosphere, at a temperature in a range between 700° C. and 800° C., and a time period in a range between 5 minutes and 30 minutes.

In an embodiment, the fins further include a second set of fins configured to form a plurality of second type devices. The method further includes, prior to removing the portion of each of the first set of fins, forming a first barrier layer on the semiconductor structure, and removing a portion of the first barrier layer disposed on the first set of fins to expose the portion of the first set of fins not covered by the gate structure.

In an embodiment, the method also includes, after performing the second annealing process, forming a second barrier layer on the second epitaxially grown regions, removing a portion of the first barrier layer on the second set of fins exposing a portion of the second set of fins that is not covered by the gate structure, removing the exposed portion of the second set of fins that is not covered by the gate structure to form a remaining portion of each of the second set of fins, performing a third epitaxially growth process to form a plurality of third epitaxially grown regions on the remaining portion of each of the second set of fins, performing a third annealing process so that a volume of an upper portion of each of the third epitaxially grown regions increases and a volume of a lower portion of each of the third epitaxially grown regions decreases, the third epitaxially grown regions are separated from each other before and after the third annealing process, performing a fourth epitaxially growth process to form a plurality of fourth epitaxially grown regions on corresponding annealed third epitaxially grown regions, and performing a fourth annealing process so that a volume of an upper portion of each of the fourth epitaxially grown regions increases and a volume of a lower portion of each of the fourth epitaxially grown regions decreases. The fourth epitaxially grown regions are separated from each other before and after the fourth annealing process.

In an embodiment, the third annealing process is performed in situ in a hydrogen atmosphere, at a temperature in a range between 700° C. and 800° C., and a time period in a range between 5 minutes and 30 minutes. The fourth annealing process is performed in situ in a hydrogen atmosphere, at a temperature in a range between 700° C. and 800° C., and a time period in a range between 5 minutes and 30 minutes. In an embodiment, the semiconductor layer of the fins is silicon, and the first epitaxially grown regions comprise SiGe or SiP.

Embodiments of the present invention also provide a semiconductor device. The semiconductor device includes a semiconductor substrate having a substrate structure including a semiconductor substrate, a plurality of fins including a semiconductor layer extending into the semiconductor substrate and a first set of fins configured to form a plurality of first type devices, and a gate structure disposed on the fins. The semiconductor device also includes a plurality of first epitaxially grown regions each disposed on one of the first set of fins, the first epitaxially grown regions are separated from each other, and a volume of an upper portion of each of the first epitaxially grown regions is greater than a volume of a lower portion of each of the first epitaxially grown regions.

In an embodiment, the fins further comprise a second set of fins configured to form a plurality of second type devices. The semiconductor device further includes a plurality of second epitaxially grown regions each disposed on one of the second set of fins, the second epitaxially grown regions are separated from each other, and a volume of an upper portion of each of the second epitaxially grown regions is greater than a volume of a lower portion of each of the second epitaxially grown regions.

In an embodiment, the semiconductor layer of the fins is silicon, and the first epitaxially grown regions comprise SiGe or SiP.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

FIG. 3G is a cross-sectional view of an intermediate stage of a manufacturing method according to another embodiments of the present invention.

FIG. 3H1 is a cross-sectional view of an intermediate stage of a manufacturing method according to another embodiments of the present invention.

FIG. 3H2 is a cross-sectional view of an intermediate stage of a manufacturing method according to yet another embodiments of the present invention.

DETAILED DESCRIPTION OF THE INVENTION

Figure 1:
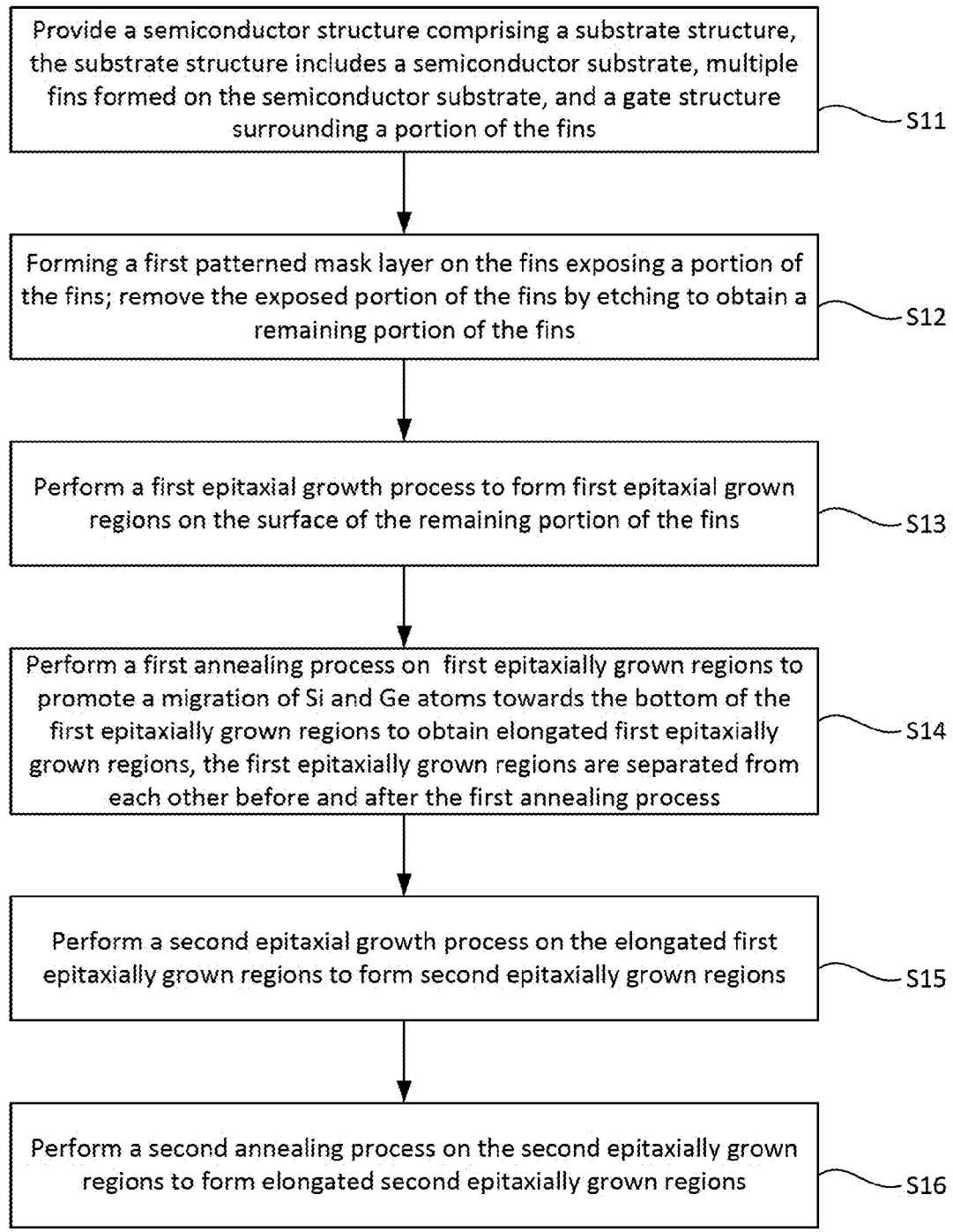
FIG. 1 is a flowchart illustrating a manufacturing method according to an embodiment of the present invention.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

As described in the background section, when the silicide layers of adjacent source regions are joined together, the surface area of the joined silicide layers is relatively small and the contact resistance is high, or when the silicide layers of adjacent source regions are not joined together, the volume of the epitaxial silicide layers is relatively small, the surface of the contact element has a polygonal shape, the surface area of the contact element is small, and the contact element has a high resistance. Thus, the present inventor provide a method for manufacturing a semiconductor device that can provide a large volume and a large surface area of the source or drain region to reduce the contact resistance.

In accordance with some embodiments of the present invention, FIG. 1 is a flowchart diagram illustrating a manufacturing method according to an embodiment of the present invention. FIGS. 2A through 2F are cross-sectional views of intermediate stages of a manufacturing method according to some embodiments of the present invention. In the disclosure, each drawing or block in the flowchart diagram represents a process associated with embodiments of the method described. Those of skill in the art will recognize that additional blocks and drawings that described the embodiments may be added.

Referring to FIG. 1, in block S11, a semiconductor structure is provided. The semiconductor structure includes a substrate structure having a semiconductor substrate, multiple fins extending into the semiconductor substrate, and a gate structure disposed on a portion of the fins. The fins may include a first set of fins configured to form first type devices.

Figure 2A:
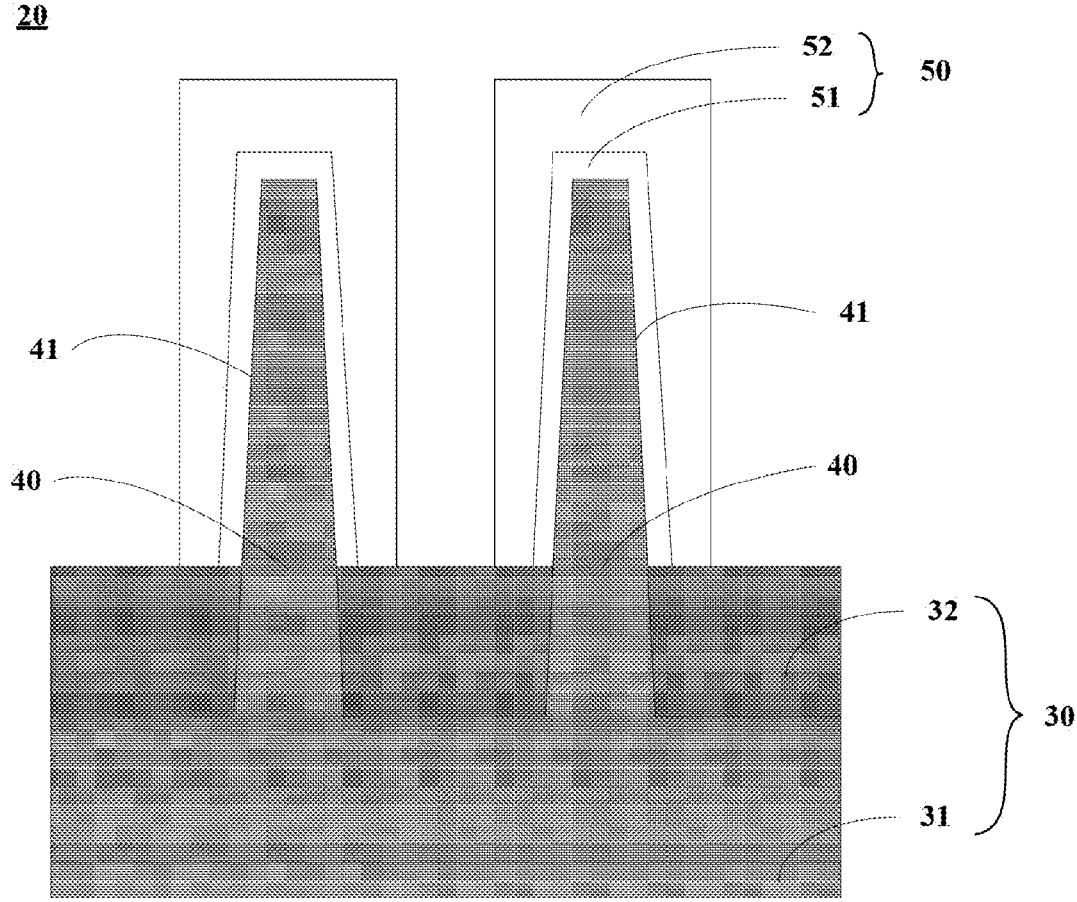
FIG. 2A is a cross-sectional view of an intermediate stage of a manufacturing method according to some embodiments of the present invention.

FIG. 2A is a cross-sectional view of a source region or a drain region of a semiconductor structure 20 and illustrating a gate structure according to some embodiments of the present invention. As shown in FIG. 2A, semiconductor structure 20 includes a substrate structure 30, a multitude of fins 41 extending into substrate structure 30, and a gate structure 50 disposed on a portion of each of the fins 41.

Substrate structure 30 includes a semiconductor substrate (e.g., silicon) 31.

Fins 41 each include a semiconductor layer (e.g., silicon layer) 40, which extends into semiconductor substrate 31. Fins 41 may include a first set of fins configured to form a plurality of first type devices.

Gate structure 50 may include a gate insulating material (e.g., silicon dioxide) 51, and a gate electrode 52 (e.g., polysilicon or metal gate) disposed on gate insulating material 51. A channel region (not shown) is below gate structure 50 and between the source region and the drain region.

For the clarity of illustration, in the following drawings, the gate structure will not be shown. Those skilled in the art will appreciate the location of the gate structure in the description of the following process steps.

In some embodiments, substrate structure 30 may also include an insulating layer 32 disposed on semiconductor substrate 31, and fins 41 protrude over insulating layer 32.

It is understood that the term "fin" used herein refers to the portion of the fin that protrudes from the substrate structure (including the semiconductor substrate and the insulating layer on the semiconductor substrate) to simplify the description. However, the fin may also have the broad definition of a fin shaped structure to form the body of a FinFET device.

Referring back to FIG. 1, in block S12, at least an exposed portion of fins 41 not covered by the gate structure is removed.

Figure 2B:
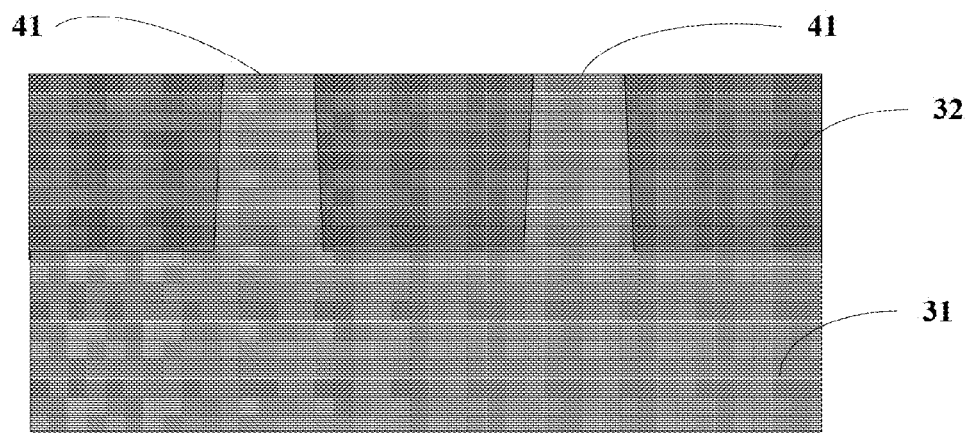
FIG. 2B is a cross-sectional view of an intermediate stage of a manufacturing method according to some embodiments of the present invention.

FIG. 2B is a cross-sectional view of an intermediate stage of a semiconductor device fabrication method after block S12 has been performed. As shown in FIG. 2B, the portion of first set of fins 41 not covered by the gate structure has been removed.

In some embodiments, block S12 may include forming a first patterned mask on the first set of fins, e.g., a patterned photoresist layer (not shown), to expose a portion of the first set of fins, and removing the exposed portion of the first set of fins by etching using the first patterned mask as a mask to form a remaining portion of the first set of fins.

Referring back to FIG. 1, in block S13, a first epitaxial growth of a material is performed on the surface of the remaining portion of the first set of fins to form an epitaxial grown region.

Figure 2C:
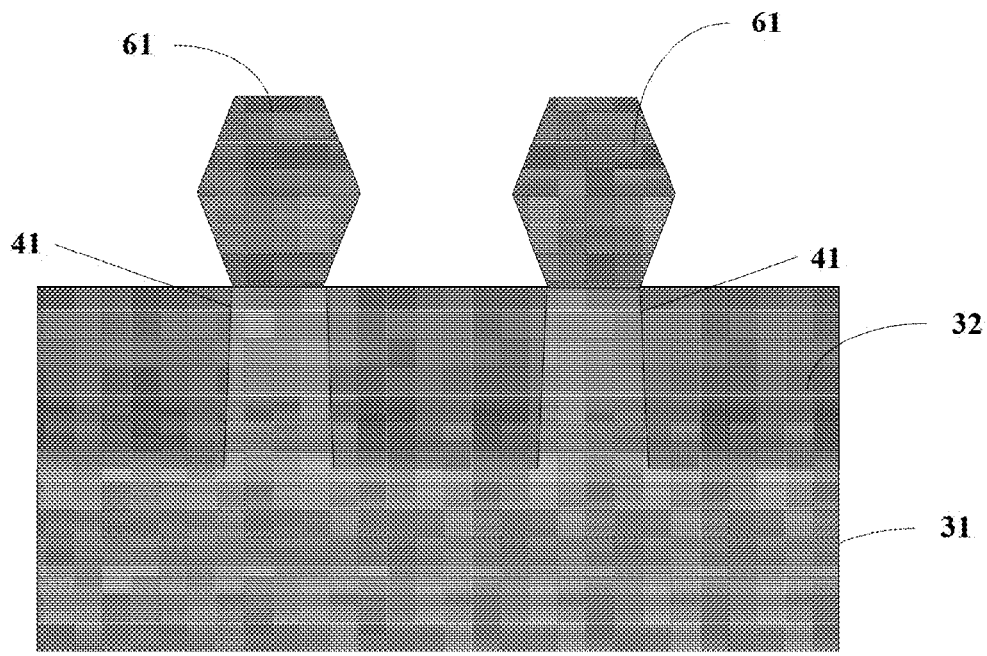
FIG. 2C is a cross-sectional view of an intermediate stage of a manufacturing method according to some embodiments of the present invention.

FIG. 2C is a cross-sectional view of an intermediate stage of a semiconductor device fabrication method after block S13 has been performed. As shown in FIG. 2C, a first epitaxially grown extension region 61 is formed on the remaining portion of the first set of fins by performing a first epitaxial growth of a material. As used herein, an epitaxially grown extension region may be referred to as one or more epitaxially grown regions. An epitaxially grown extension region may be referred to collectively as epitaxially grown source and drain regions. An epitaxially grown extension source/drain region or regions are alternatively referred to as an epitaxially grown region or epitaxially grown regions hereinafter.

In some embodiments, fins 41 may be silicon, and the epitaxial grown material may be a silicon-germanium (SiGe) or silicon-phosphorus (SiP) material. For example, the first set of fins are configured to be used for forming N-channel fin devices, the epitaxial grown material is SiGe. The first epitaxial growth may be doped in situ, e.g., boron may be implanted in situ to form a first epitaxial P-type grown region (SiGe).

Referring back to FIG. 1, in block S14, a first annealing process is performed on the first epitaxial P-type grown region, so that the volume of the lower portion of the first epitaxial P-type grown region increases and the volume of the upper portion of the first epitaxial P-type grown region decreases. It is noted that the first epitaxial P-type grown region on the remaining portion of each fin of the first set of fins is separated from each other before and after the first annealing process.

Figure 2D:
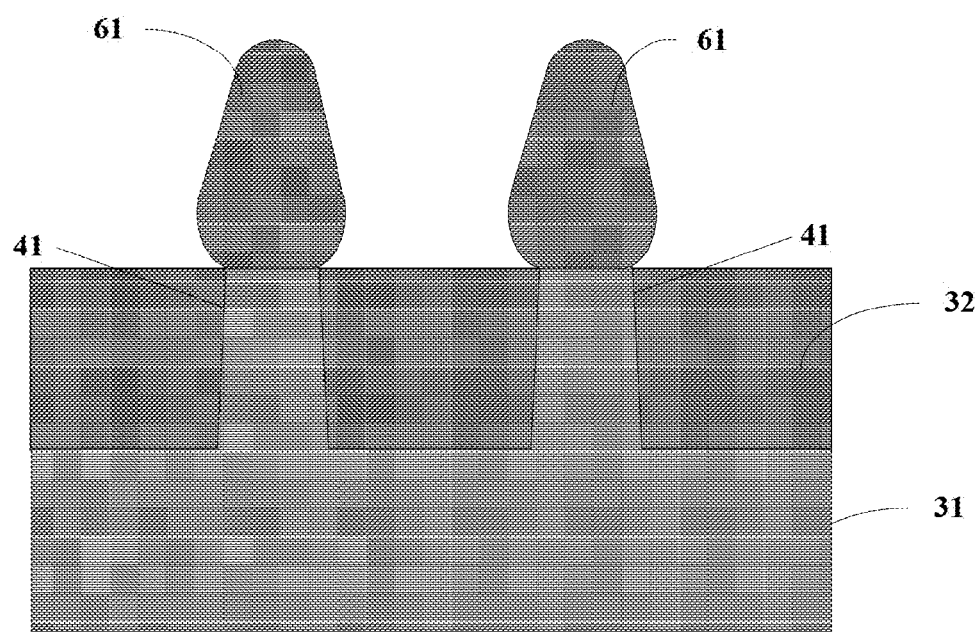
FIG. 2D is a cross-sectional view of an intermediate stage of a manufacturing method according to some embodiments of the present invention.

FIG. 2D is a cross-sectional view of an intermediate stage of a semiconductor device fabrication method after block S14 has been performed. As shown in FIG. 2D, a first annealing process is performed on epitaxially grown region 61, so that the volume of the lower portion of epitaxially grown region 61 increases and the volume of the upper portion of epitaxially grown region 61 decreases. Epitaxially grown regions 61 on fins 41 are separated from each other before and after the first annealing process. During the first annealing process, Si and Ge atoms migrate towards the bottom of the first epitaxially grown regions, so that the volume of the lower portion of epitaxially grown region 61 increases and the volume of the upper portion of epitaxially grown region 61 decreases, thereby forming an elongated shape. In some embodiments, as shown in FIG. 2D, the upper end of the epitaxially grown region has a fingertip shape or strawberry shape, and the epitaxially grown region has a substantially smooth curved surface.

In some embodiments, the first annealing process may be performed in situ. Herein, the term "in situ annealing" refers to that the semiconductor device after the epitaxial growth remains in the epitaxial growth chamber, and the annealing process is directly performed in the epitaxial growth chamber. The in-situ annealing process can prevent the epitaxially grown region from exposing to air outside of the chamber to form an oxide thereon.

In some embodiments, the first annealing process may be performed in a hydrogen atmosphere, at a temperature in the range between 700° C. and 800° C., and for a time period in the range between 5 minutes and 30 minutes. Preferably, the first annealing process may be performed in a hydrogen atmosphere, at a temperature of 750° C., and for an annealing time period of 20 minutes. For example, the first annealing process may be used to anneal an SiGe epitaxial grown material.

Referring back to FIG. 1, in block S15, after the first annealing process has been performed, a second epitaxial growth process will be performed on the first epitaxially grown region to form a second epitaxially grown region.

Figure 2E:
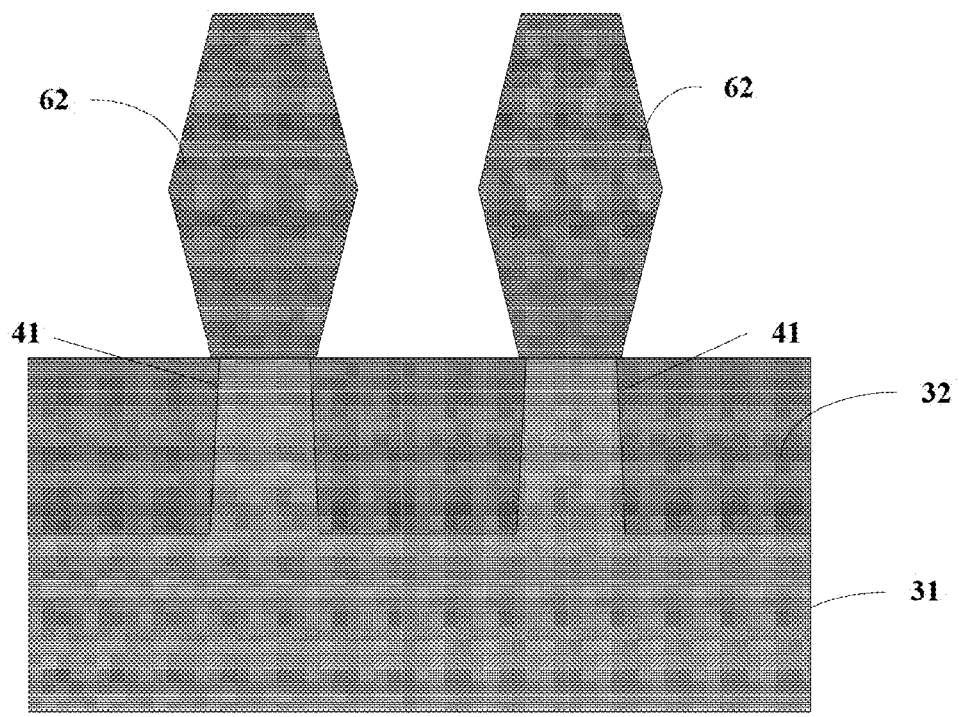
FIG. 2E is a cross-sectional view of an intermediate stage of a manufacturing method according to some embodiments of the present invention.

FIG. 2E is a cross-sectional view of an intermediate stage of a semiconductor device fabrication method after block S15 has been performed. As shown in FIG. 2E, a second annealing process is performed on the first epitaxially grown region formed after the first annealing process has been performed to form a second epitaxially grown region 62. It is noted that the surface of second epitaxially grown region 62 has a polygonal shape.

In some embodiments, the epitaxially grown material of the second epitaxially grown region may correspond to the epitaxially grown material of the first epitaxially grown region, such as silicon-germanium (SiGe) or silicon-phosphorous (SiP). For example, if the epitaxially grown material of the first epitaxially grown region is SiGe, then the epitaxially grown material of the second epitaxially grown region may also be SiGe.

Referring back to FIG. 1, in block S16, a second annealing process is performed on the second epitaxially grown region, so that the volume of the lower portion of the second epitaxially grown region increases and the volume of the upper portion of the second epitaxially grown region decreases. Epitaxially grown regions 62 on fins 41 are separated from each other before and after the second annealing process.

Figure 2F:
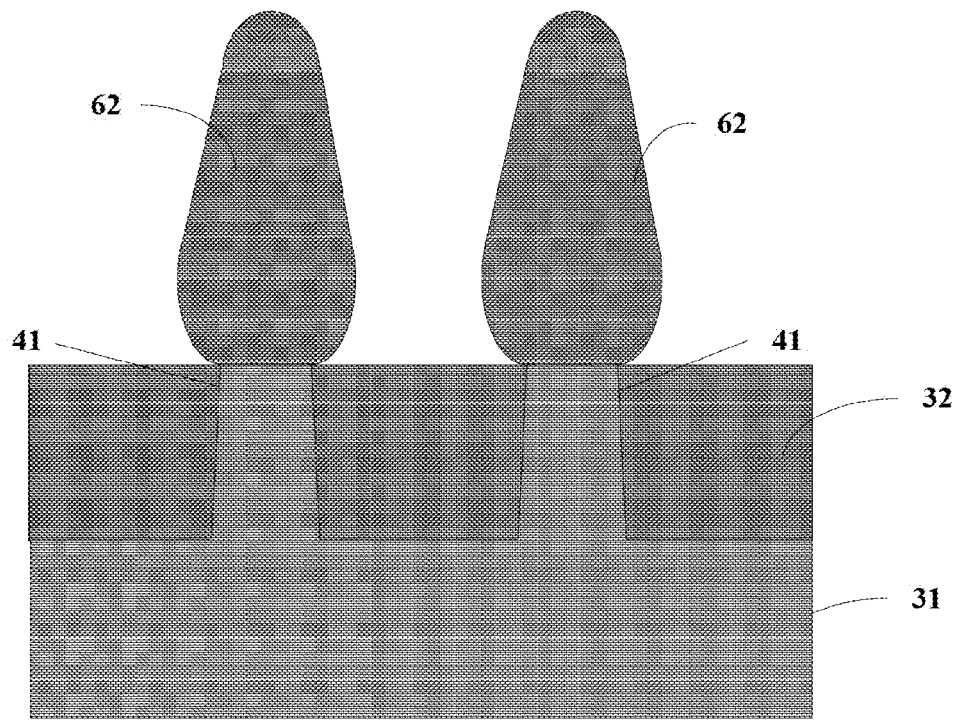
FIG. 2F is a cross-sectional view of an intermediate stage of a manufacturing method according to some embodiments of the present invention.

FIG. 2F is a cross-sectional view of an intermediate stage of a semiconductor device fabrication method after block S16 has been performed. As shown in FIG. 2F, a second annealing process is performed on second epitaxially grown region 62, so that the volume of the lower portion of the second epitaxially grown region increases and the volume of the upper portion of the second epitaxially grown region decreases. Epitaxially grown regions 62 on fins 41 are separated from each other before and after the second annealing process. The second annealing process promotes the migration of Si atoms and Ge atoms, the migration of the Si and Ge atoms towards the bottom of the epitaxially grown region 62 causes the volume of the lower portion of epitaxially grown region 62 to increase and the volume of the upper portion of epitaxially grown region 61 to decrease, thereby forming a shape that is elongated or extended. In some embodiments, as shown in FIG. 2F, the upper end of the epitaxially grown region has a fingertip-like shape or strawberry-like shape, and the epitaxially grown region has a substantially smooth curved surface.

In some embodiments, the second annealing process may be in-situ performed in a hydrogen atmosphere, at a temperature in the range between 700° C. and 800° C., and for a time period in the range between 5 minutes and 30 minutes. Preferably, the second annealing process may be performed in a hydrogen atmosphere, at a temperature of 750° C., and for an annealing time period of 20 minutes.

Embodiments of the present invention thus provide a method for manufacturing a semiconductor device. By performing two annealing processes, the volume of each of the epitaxially grown regions increases, the relatively elongated or extended shape of the epitaxially grown regions is fingertip like or strawberry like, and the epitaxially grown regions are separated from each other, so that the stress effect increases, the surface area of the contact element increases, resulting in a decrease in the contact resistance, thereby improving the semiconductor device performance.

Of course, the scope of the embodiments of the present invention is not limited to two epitaxially growth processes and two annealing process steps. It is possible to have more than two epitaxially growth and two annealing process steps, such as three epitaxially growth processes and three annealing process steps.

In some embodiments of the present invention, the fins may also include a second set of fins configured to form second type devices. Prior to the removal step in block S12, the method may also include forming a first barrier layer on the semiconductor structure, removing a portion of the first barrier layer on the first set of fins to expose a portion of the first set of fins that is not covered by the corresponding gate structure.

Figure 3A:
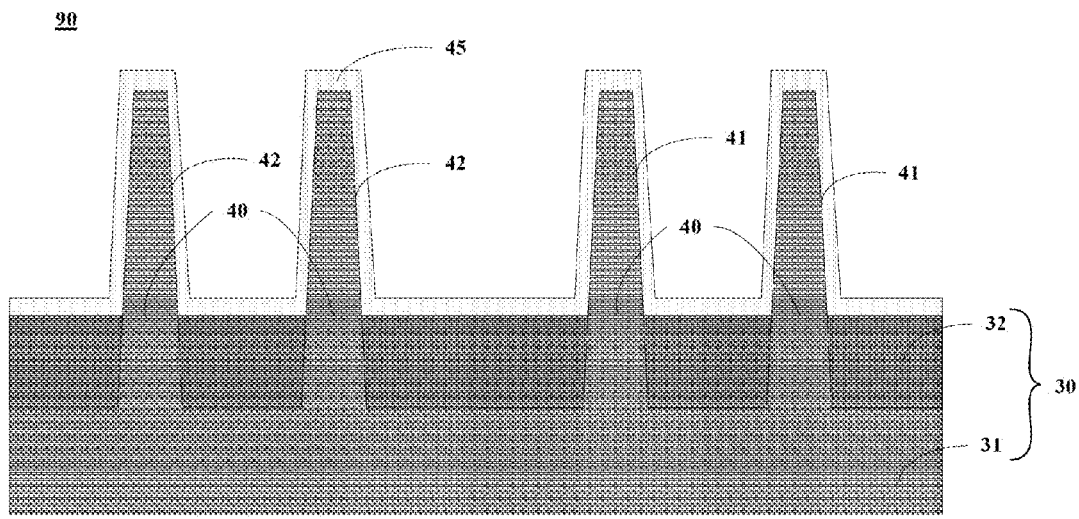
FIG. 3A is a cross-sectional view of an intermediate stage of a manufacturing method according to another embodiments of the present invention.
Figure 3B:
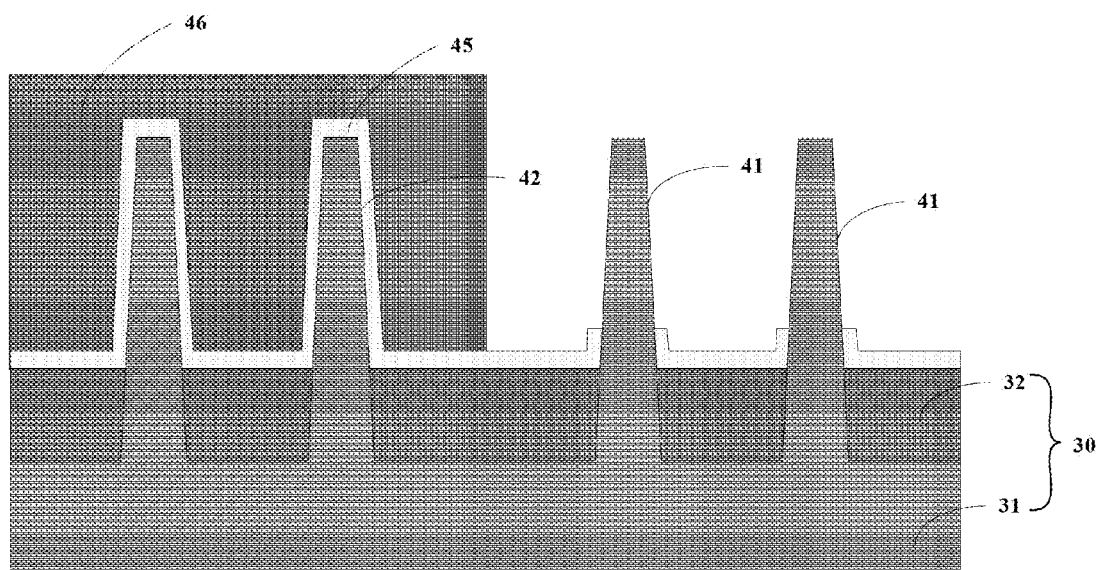
FIG. 3B is a cross-sectional view of an intermediate stage of a manufacturing method according to another embodiments of the present invention.
Figure 3C:
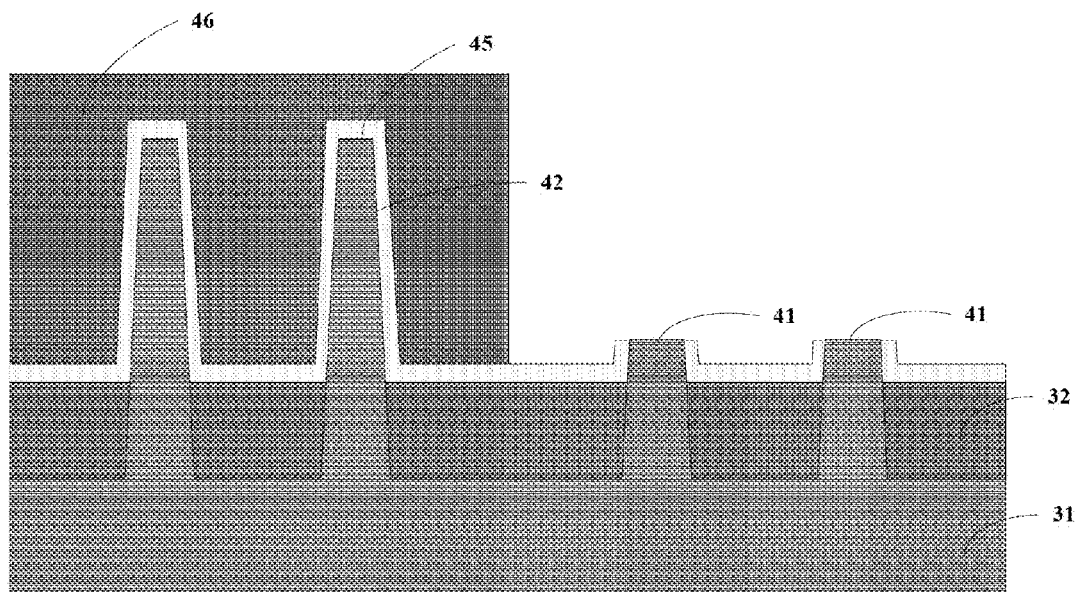
FIG. 3C is a cross-sectional view of an intermediate stage of a manufacturing method according to another embodiments of the present invention.
Figure 3D:
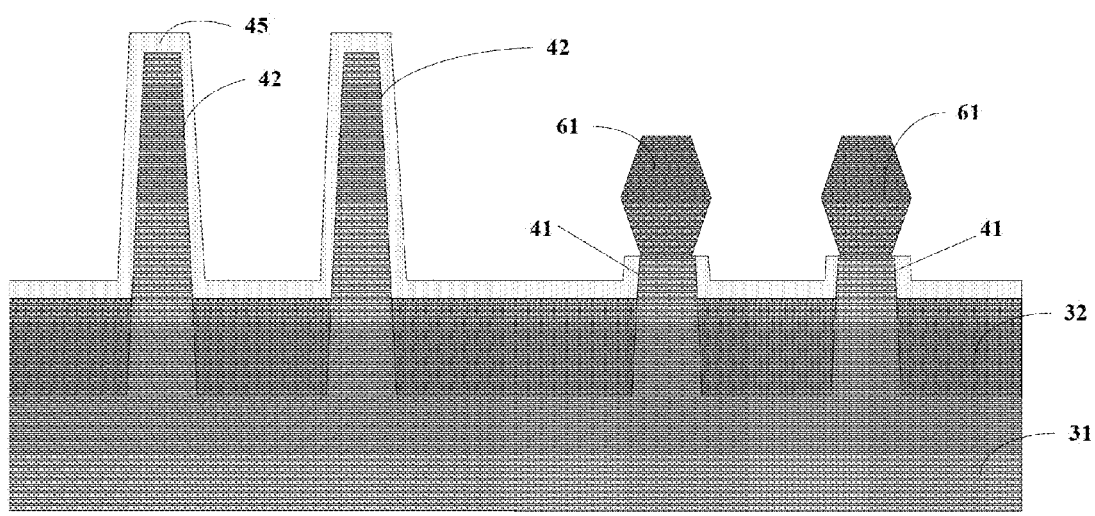
FIG. 3D is a cross-sectional view of an intermediate stage of a manufacturing method according to another embodiments of the present invention.
Figure 3E:
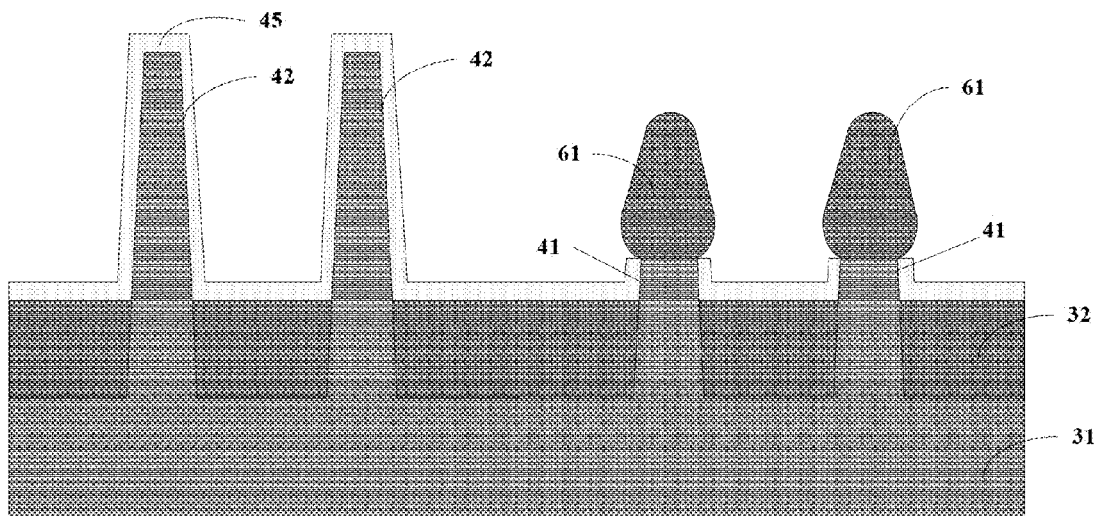
FIG. 3E is a cross-sectional view of an intermediate stage of a manufacturing method according to another embodiments of the present invention.
Figure 3F:
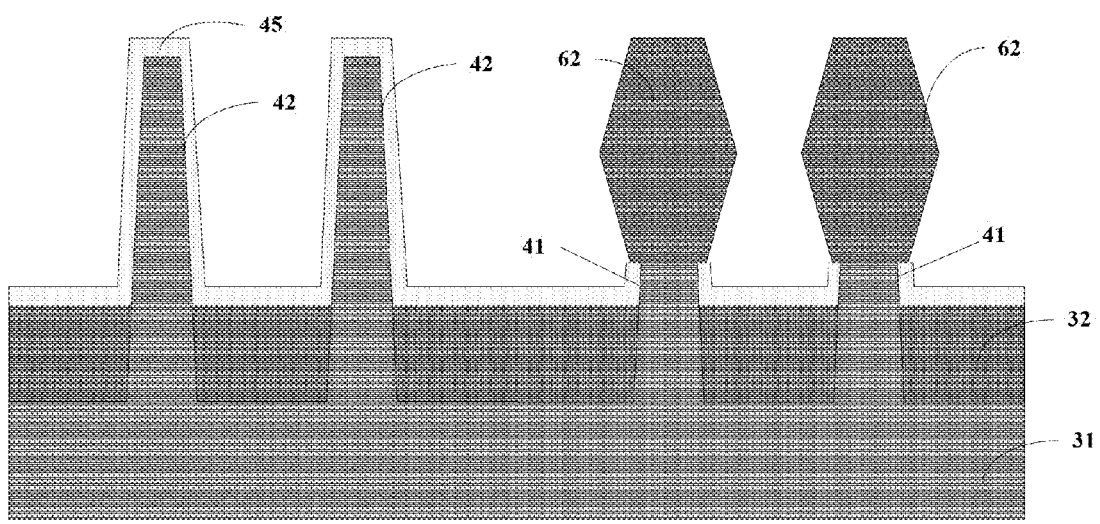
FIG. 3F is a cross-sectional view of an intermediate stage of a manufacturing method according to another embodiments of the present invention.
Figure 3I:
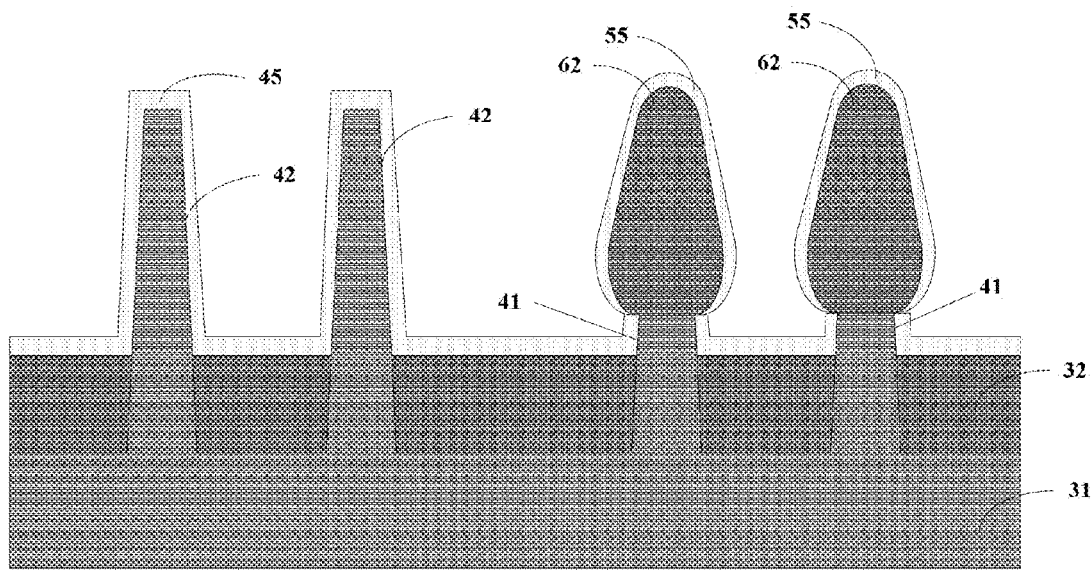
FIG. 3I is a cross-sectional view of an intermediate stage of a manufacturing method according to another embodiments of the present invention.
Figure 3I:
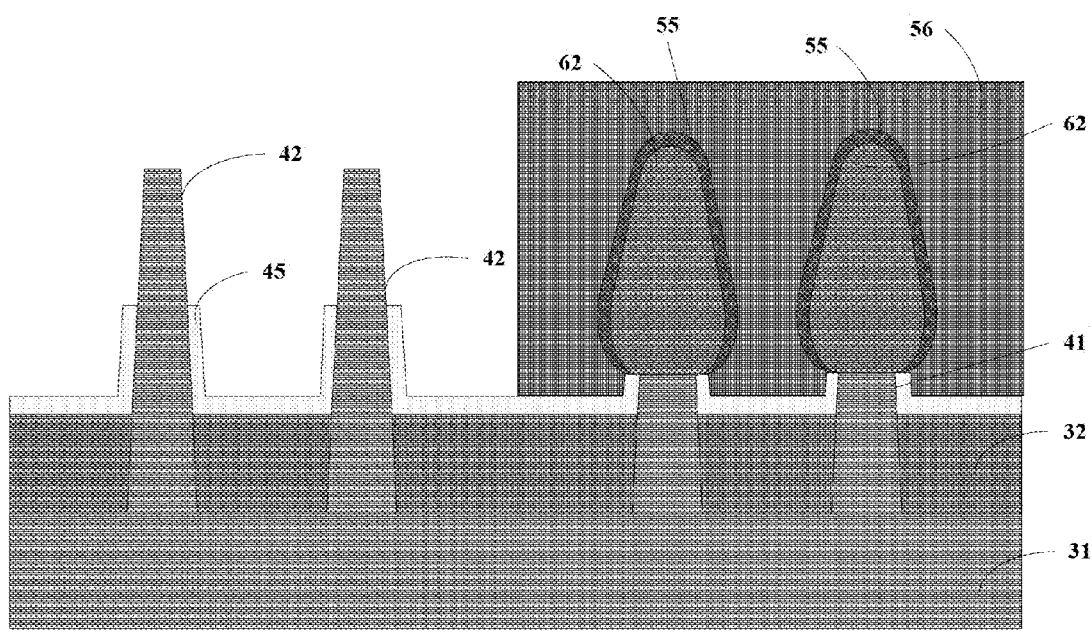
Figure 3J:
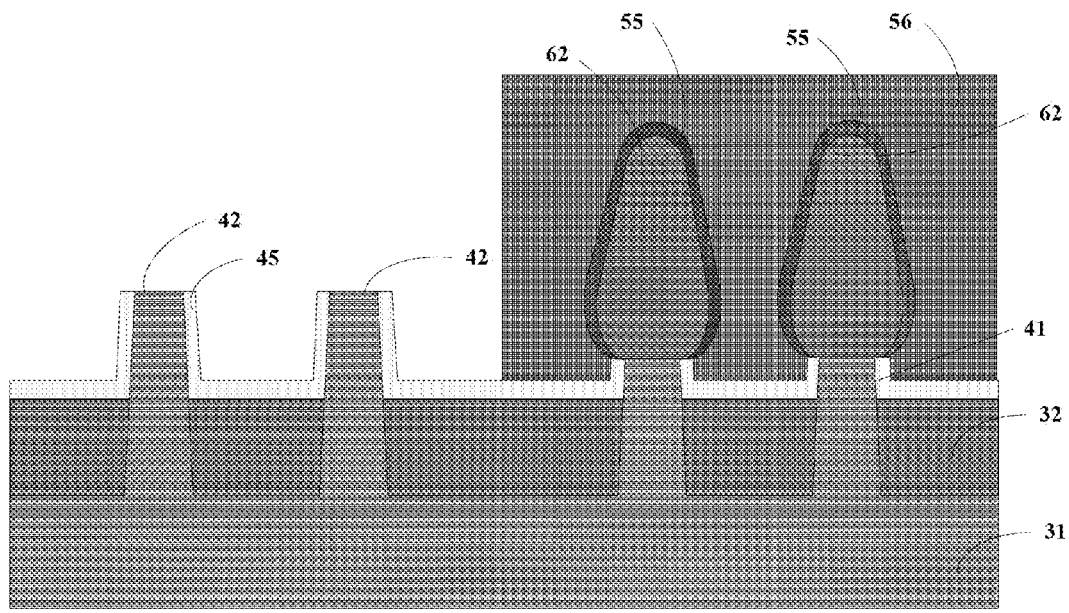
FIG. 3J is a cross-sectional view of an intermediate stage of a manufacturing method according to another embodiments of the present invention.
Figure 3K:
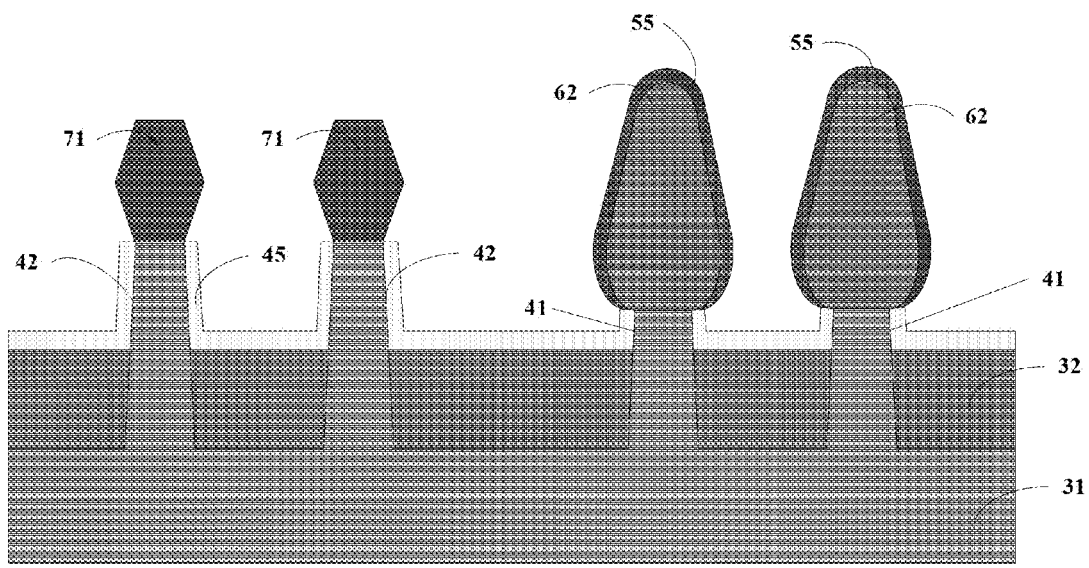
FIG. 3K is a cross-sectional view of an intermediate stage of a manufacturing method according to another embodiments of the present invention.
Figure 3L:
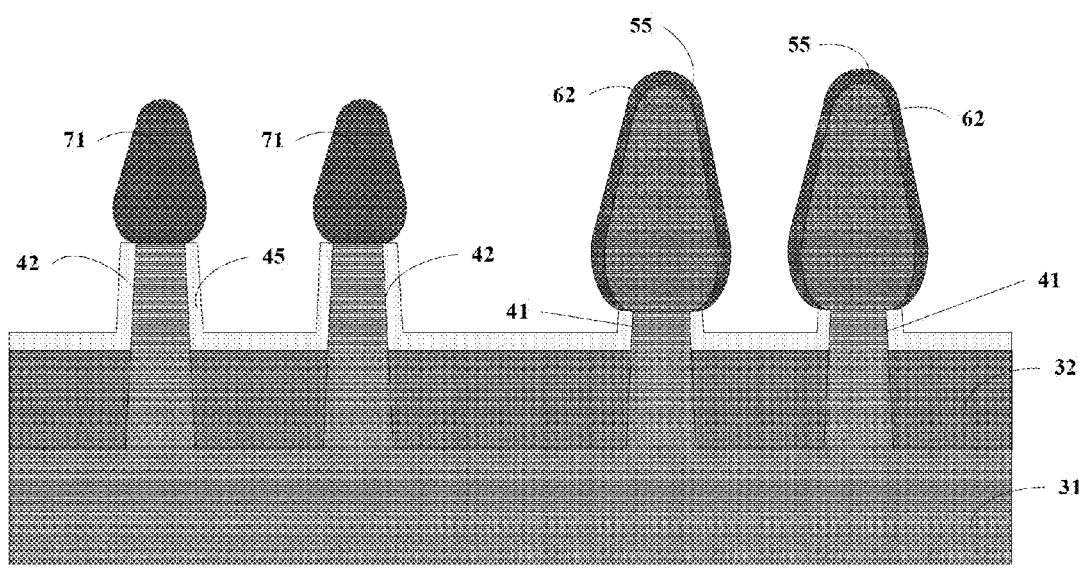
FIG. 3L is a cross-sectional view of an intermediate stage of a manufacturing method according to another embodiments of the present invention.
Figure 3M:
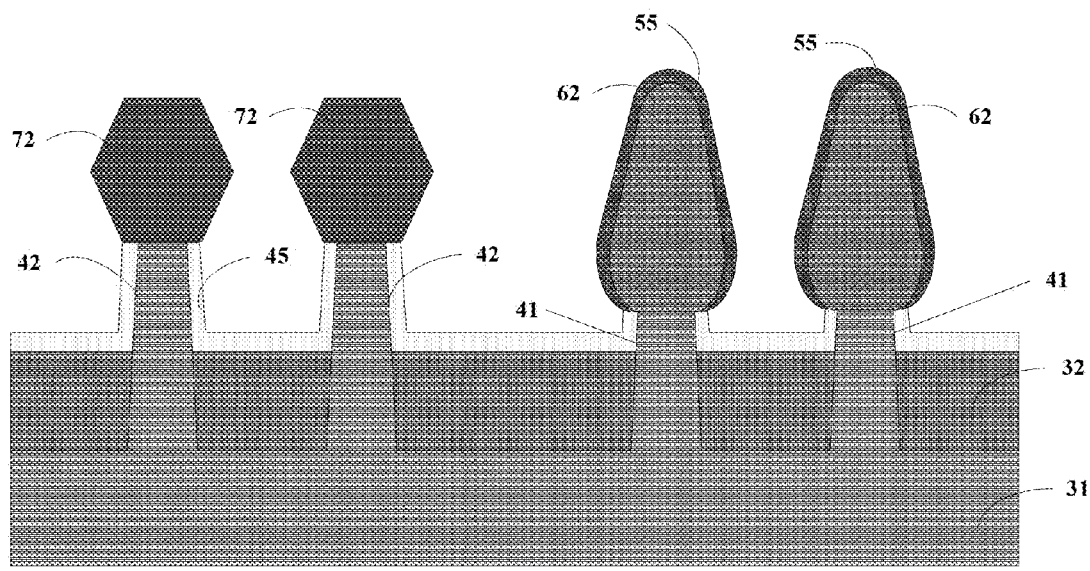
FIG. 3M is a cross-sectional view of an intermediate stage of a manufacturing method according to another embodiments of the present invention.
Figure 3N:
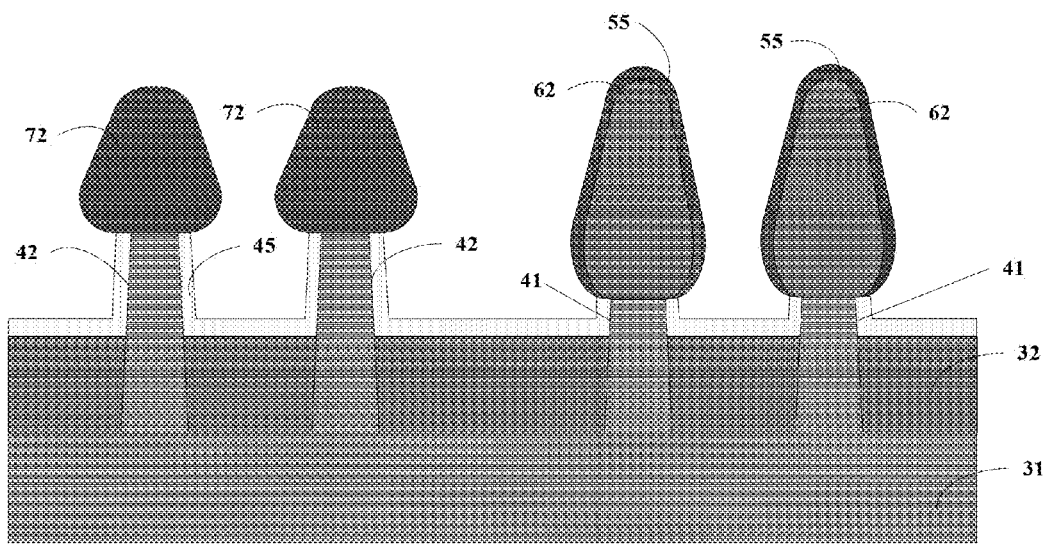
FIG. 3N is a cross-sectional view of an intermediate stage of a manufacturing method according to another embodiments of the present invention.
Figure 3O:
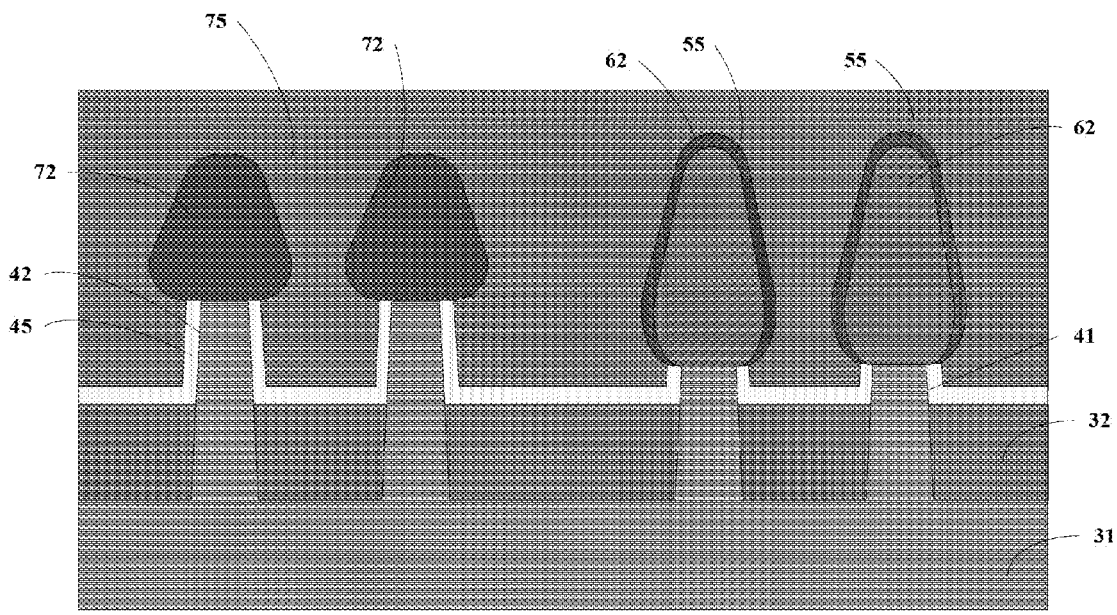
FIG. 3O is a cross-sectional view of an intermediate stage of a manufacturing method according to another embodiments of the present invention.
Figure 3P:
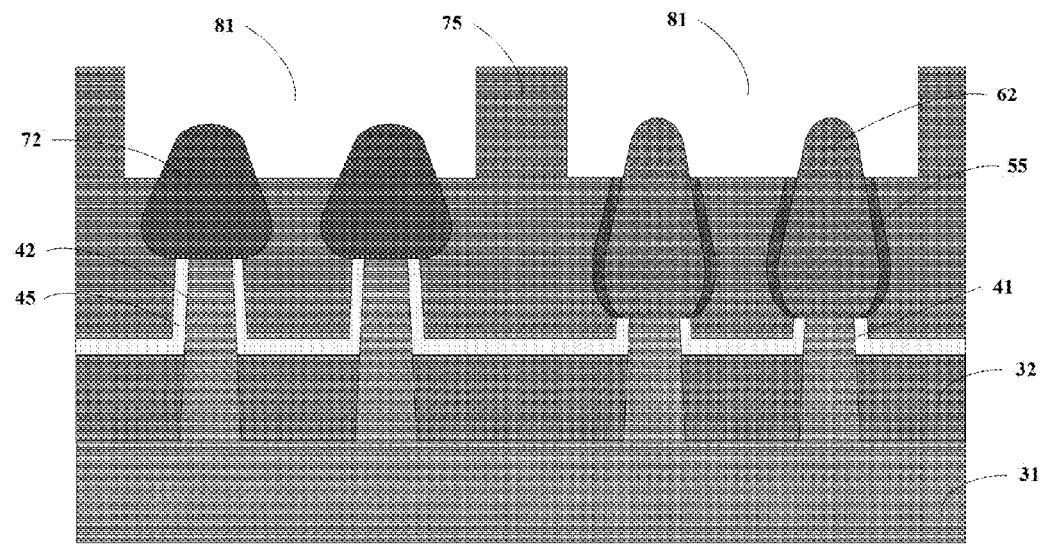
FIG. 3P is a cross-sectional view of an intermediate stage of a manufacturing method according to another embodiments of the present invention.
Figure 3Q:
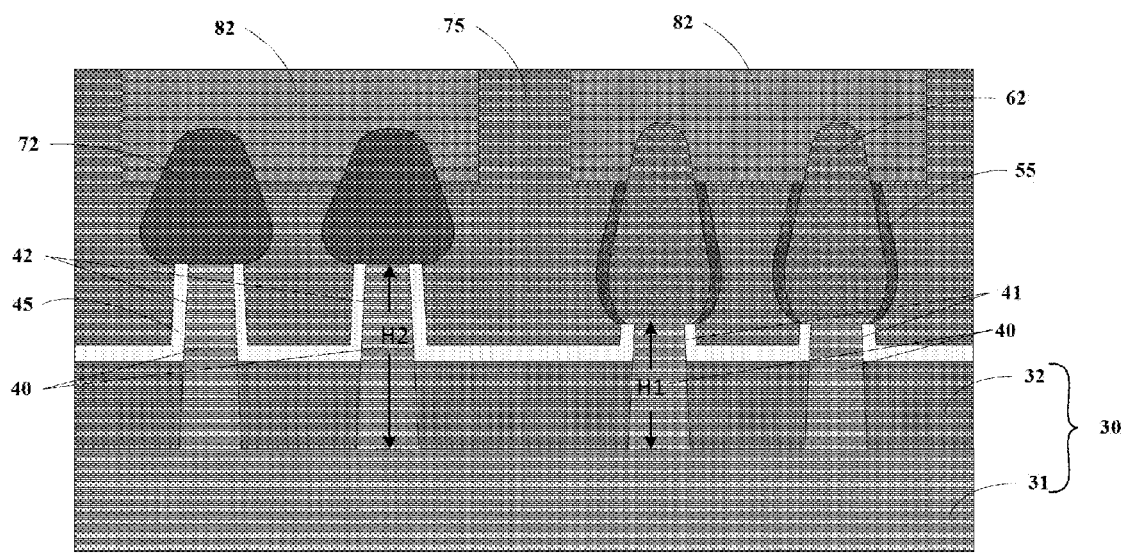
FIG. 3Q is a cross-sectional view of an intermediate stage of a manufacturing method according to another embodiments of the present invention.

FIGS. 3A through 3Q are cross-sectional views of intermediate stages of a manufacturing method according to some embodiments of the present invention.

Referring to FIG. 3A, a semiconductor structure 90 is provided. Semiconductor structure 90 includes a substrate structure 30, a plurality of fins 40 protruding from substrate structure 30, and a gate structure (not shown in FIG. 3A) surrounding a portion of the fins.

Substrate structure 30 may include a semiconductor substrate (e.g., silicon) 31 and an insulating layer 32 on semiconductor substrate 31.

The fins may include s semiconductor layer (e.g., a silicon layer) 40 extending into semiconductor substrate 31 and protruding out of insulating layer 32. Fins 40 may include a first set of fins 41 configured to form a plurality of first type devices and a second set of fins 42 configured to form a plurality of second type devices. For example, the first type devices can be PMOS transistor devices, and the second type devices may be NMOS transistor devices.

Next, a first barrier layer 45 is formed on semiconductor structure 90, as shown in FIG. 3A. First barrier layer 45 may be silicon oxide, silicon nitride, or the like. First barrier layer 45 may be formed using a deposition process.

Next, a portion of first barrier layer 45 disposed on first set of fins 41 is removed to expose a portion of first set of fins 41 that is not covered by the corresponding gate structure. In an exemplary embodiment, a first patterned mask (e.g., photoresist) 46 is formed covering second set of fins 42 and exposing first set of fins 41, a portion of first barrier layer 42 on an upper portion of first set of fins 41 is then removed using patterned mask 46 as a mask to expose the upper portion of first set of fins 41, as shown in FIG. 3B.

Next, the exposed upper portion of first set of fins 41 is removed by etching to form a remaining portion of first set of fins 41, as shown in FIG. 3C. Thereafter, first patterned mask 46 is removed.

Next, a first epitaxial growth process is performed to form first epitaxially grown regions 61 on the exposed surface of the remaining portion of first set of fins 41, as shown in FIG. 3D. For example, the first set of fins is made of silicon, and the first epitaxially grown region is made of SiGe.

Next, a first annealing process is performed on first epitaxially grown regions 61 to promote the migration of Si atoms and Ge atoms, the migration of the Si and Ge atoms towards the bottom of the epitaxially grown regions 62 causes the volume of the lower portion of epitaxially grown regions 62 to increase and the volume of the upper portion of first epitaxially grown regions 61 to decrease, as shown in FIG. 3E. First epitaxially grown regions 61 are separated from each other before and after the first annealing process.

Next, a second epitaxial growth process is performed on the annealed first epitaxially grown regions 61 to form a second epitaxially grown regions 62, as shown in FIG. 3F. For example, the second epitaxially grown regions may include SiGe.

Next, a second annealing process is performed on second epitaxially grown regions 62 to promote the migration of Si atoms and Ge atoms to increase the volume of the lower portion of the second epitaxially grown regions and decrease the volume of the upper portion of the second epitaxially grown regions, as shown in FIG. 3G. Second epitaxially grown regions 62 are separated from each other before and after the second annealing process.

In the embodiment, after the second annealing process has been performed, the method may further include the following process steps:

Referring to FIG. 3H1 or 3H2, a second barrier layer 55 is formed on annealed second epitaxially grown regions 62. The second barrier layer may be formed by oxidation or deposition. The second barrier layer may include silicon oxide, silicon nitride, or the like. In one embodiment, second barrier layer 55 is shown as being formed by oxidation on second epitaxially grown region 62, as shown in FIG. 3H1. In another embodiment, second barrier layer 55 is shown as being formed by deposition on second epitaxially grown regions 62, as shown in FIG. 3H2. In the following, in order to facilitate the description and illustration, the second barrier layer and the remaining of the first barrier layer are presented together as a barrier layer.

Next, an upper portion of first barrier layer 45 on second set of fins is removed to exposed a portion of second set of fins not covered by first barrier layer 45, as shown in FIG. 3I. For example, a second patterned mask (e.g., photoresist) 56 is formed on first set of fins and first epitaxially grown region 62, the exposed portion of second set of fins 42 not covered by the upper portion of first barrier layer 45 is removed using an etching process to form a remaining portion of second set of fins, as shown in FIG. 3J. Thereafter, second patterned mask 56 is removed.

In some embodiments, the remaining portion of second set of fins is higher than the remaining portion of first set of fins, as shown in FIG. 3J. The higher remaining portion of second set of fins facilities the epitaxial growth thereon.

Next, a third epitaxial growth is performed on the remaining portion of second set of fins to form a third epitaxially grown region 71, as shown in FIG. 3K. For example, the third epitaxially grown region is SiP.

Next, a third annealing process is performed on third epitaxially grown region 71 to increase the volume of the lower portion of the third epitaxially grown regions and decrease the volume of the upper portion of the second epitaxially grown regions, as shown in FIG. 3L. The third epitaxially grown regions are separated from each other before and after the third annealing process. The third annealing process causes Si atoms to migrate towards the lower portion of the third epitaxially grown region, so that the volume of the lower portion of the third epitaxially grown region increases and the volume of the upper portion of the third epitaxially grown region decreases, and the third epitaxially grown region has an elongate form.

In some embodiments, the third annealing process may be performed in situ. The third annealing process may be performed under a hydrogen atmosphere, at a temperature in the range between 700° C. and 800° C., and for a time period in the range between 5 minutes and 30 minutes. Preferably, the third annealing process may be performed under a hydrogen atmosphere, at a temperature of 750° C., and for an annealing time period of 20 minutes.

Next, a fourth epitaxial growth is performed to form fourth epitaxially grown regions 72, and the surface of fourth epitaxially grown regions 72 may have a polygonal shape as shown in FIG. 3M. For example, the fourth epitaxially grown regions may be made of SiP.

Next, a fourth annealing process is performed on fourth epitaxially grown regions 72 to increase the volume of the lower portion of the fourth epitaxially grown regions and decrease the volume of the upper portion of the fourth epitaxially grown regions, as shown in FIG. 3N. The fourth epitaxially grown regions are separated from each other before and after the fourth annealing process. The fourth annealing process causes Si atoms to migrate towards the lower portion of the fourth epitaxially grown region, so that the volume of the lower portion of the fourth epitaxially grown regions increases and the volume of the upper portion of the fourth epitaxially grown region decreases, and the fourth epitaxially grown regions each have an elongated or extended form. The upper end of the fins have a fingertip shape or strawberry shape, and the fourth epitaxially grown regions each have a significantly smooth curved surface.

In some embodiments, the fourth annealing process may be performed in situ. The fourth annealing process may be performed under a hydrogen atmosphere, at a temperature in the range between 700° C. and 800° C., and for a time period in the range between 5 minutes and 30 minutes. Preferably, the fourth annealing process may be performed under a hydrogen atmosphere, at a temperature of 750° C., and for an annealing time period of 20 minutes.

Next, referring to FIG. 3O, an interlayer dielectric layer 75 is formed on the structure of FIG. 3N. For example, the interlayer dielectric layer may be silicon dioxide.

Next, a patterned mask (not shown) is formed on interlayer dielectric layer 75. An etching process is performed to remove a portion of interlayer dielectric layer 75 and a portion of second barrier layer 55 using the patterned mask as an etching mask to form an opening exposing at least a portion of the upper end of second epitaxially grown regions 62 and at least a portion of the upper end of fourth epitaxially grown regions 72.

Next, a contact electrode 82 is formed on the exposed portion of the upper end of second epitaxially grown regions 62 and the exposed portion of the upper end of fourth epitaxially grown regions 72, as shown in FIG. 3Q. Contact electrode 82 may be copper, aluminum, or any suitable metal material. For example, a contact material may be first deposited on the structure of FIG. 3P; a planarization (e.g., a chemical mechanical polishing) process is then performed on the contact material to form the contact electrode.

Thus, embodiments of the present invention provide another method for manufacturing a semiconductor device. In accordance with the embodiments of the present invention, second epitaxially grown regions for forming first type devices and fourth epitaxially grown regions are separately formed. For example, the first type devices are PMOS transistor devices, and the second type devices are NMOS transistor devices. By performing two epitaxial growth processes and two annealing processes, the volume of the epitaxially grown regions increase, and the epitaxially grown regions have an elongated form and the upper end of the epitaxially grown regions have a fingertip shape or strawberry shape, and a smooth curved surface. The epitaxially grown regions are separated from each other, the stress effect are larger, the contact surface area of the epitaxially grown regions are larger, and the contact resistance of the epitaxially grown regions decreases, thereby improving the semiconductor device performance.

Embodiments of the present invention also provide a semiconductor device. Referring to FIG. 3Q, the semiconductor device may include a semiconductor structure comprising a substrate structure 30, a plurality of fins protruding from the substrate structure, and a gate structure (not shown) disposed on a portion of each of the fins. Substrate structure 30 includes a semiconductor substrate (e.g., silicon) 31. The fins each include a semiconductor layer (silicon layer) 40 extending into semiconductor substrate 31. The fins may include a first set of fins 41 configured to form first type devices. First set of fins 41 each include an epitaxially grown region disposed on opposite sides of the gate structure. The epitaxially grown regions are the above-described second epitaxially grown regions 62. The epitaxially grown regions are separate from each other, and the volume of the lower portion of the epitaxially grown regions is greater than the volume of the upper portion of the epitaxially grown regions. The epitaxially grown regions may be made of SiGe or SiP.

In some embodiments, the fins of the semiconductor device may also include a second set of fins 42 configured to form second type devices, as shown in FIG. 3Q. Second set of fins each may include an epitaxially grown region disposed on opposite sides of the gate structure. The epitaxially grown regions are the above-described fourth epitaxially grown regions 72. The fourth epitaxially grown regions on the second set of fins are separate from each other, and the volume of the lower portion of the epitaxially grown regions on the second set of fins is greater than the volume of the upper portion of the epitaxially grown regions.

In some embodiments, the second set of fins on which the fourth epitaxially grown regions are formed have a height H2 that is higher than a height H1 of the first set of fins on which the second epitaxially grown regions, as shown in FIG. 3Q.

In some embodiments, the semiconductor device may also include an interlayer dielectric layer 75 disposed on the semiconductor structure, and contact electrodes 82 disposed in the interlayer dielectric layer and having electrical contact with the epitaxially grown regions 62 and 72, as shown in FIG. 3Q.

According to embodiments of the present invention, the semiconductor device includes multiple fins having elongated epitaxially grown regions and an increased volume, the epitaxially grown regions have a fingertip shape or strawberry shape and a curved surface. The epitaxially grown regions are separated from each other, so that the stress effect becomes larger, the contact surface area becomes larger, the contact resistance is reduced, thereby improving the semiconductor device performance.

Thus, embodiments of the present invention provide a semiconductor device and method for manufacturing the same that have an increase in the volume and surface area of the epitaxially grown regions, so that the contact resistance is reduced.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor structure comprising:
      a substrate structure comprising a semiconductor substrate;
      a plurality of fins comprising a semiconductor layer extending into the semiconductor substrate and a first set of fins configured to form a plurality of first type devices; and
      a gate structure disposed on the fins;
   removing a portion of each of the first set of fins not covered by the gate structure to form a remaining portion of each of the first set of fins;
   performing a first epitaxially growth process to form a plurality of first epitaxially grown regions on the remaining portion of each of the first set of fins;
   performing a first annealing process so that a volume of a lower portion of each of the first epitaxially grown regions increases and a volume of an upper portion of each of the first epitaxially grown regions decreases, the first epitaxially grown regions being separated from each other before and after the first annealing process;
   performing a second epitaxially growth process to form a plurality of second epitaxially grown regions on corresponding annealed first epitaxially grown regions; and
   performing a second annealing process so that a volume of a lower portion of each of the second epitaxially grown regions increases and a volume of an upper portion of each of the second epitaxially grown regions decreases, the second epitaxially grown regions being separated from each other before and after the second annealing process.

2. The method of claim 1, wherein the substrate structure comprises an insulating layer on the semiconductor substrate, and the fins protrude from the insulating layer.

3. The method of claim 1, wherein removing the portion of each of the fins comprises:
   forming a patterned mask exposing the portion of the fins not covered by the gate structure; and
   removing the exposed portion by etching using the patterned mask as a mask.

4. The method of claim 1, wherein the first annealing process is performed in situ in a hydrogen atmosphere, at a temperature in a range between 700° C. and 800° C., and a time period in a range between 5 minutes and 30 minutes.

5. The method of claim 1, wherein the second annealing process is performed in situ in a hydrogen atmosphere, at a temperature in a range between 700° C. and 800° C., and a time period in a range between 5 minutes and 30 minutes.

6. The method of claim 1, wherein the plurality of fins further comprise a second set of fins configured to form a plurality of second type devices, the method further comprising, prior to removing the portion of each of the first set of fins:
   forming a first barrier layer on the semiconductor structure; and
   removing a portion of the first barrier layer disposed on the first set of fins to expose the portion of the first set of fins not covered by the gate structure.

7. The method of claim 6, further comprising, after performing the second annealing process:
   forming a second barrier layer on the second epitaxially grown regions;
   removing a portion of the first barrier layer on the second set of fins exposing a portion of the second set of fins that is not covered by the gate structure;
   removing the exposed portion of the second set of fins that is not covered by the gate structure to form a remaining portion of each of the second set of fins;
   performing a third epitaxially growth process to form a plurality of third epitaxially grown regions on the remaining portion of each of the second set of fins;
   performing a third annealing process so that a volume of a lower portion of each of the third epitaxially grown regions increases and a volume of an upper portion of each of the third epitaxially grown regions decreases, the third epitaxially grown regions being separated from each other before and after the third annealing process;
   performing a fourth epitaxially growth process to form a plurality of fourth epitaxially grown regions on corresponding annealed third epitaxially grown regions; and
   performing a fourth annealing process so that a volume of a lower portion of each of the fourth epitaxially grown regions increases and a volume of an upper portion of each of the fourth epitaxially grown regions decreases, the fourth epitaxially grown regions being separated from each other before and after the fourth annealing process.

8. The method of claim 7, the third annealing process is performed in situ in a hydrogen atmosphere, at a temperature in a range between 700° C. and 800° C., and a time period in a range between 5 minutes and 30 minutes.

9. The method of claim 7, the fourth annealing process is performed in situ in a hydrogen atmosphere, at a temperature in a range between 700° C. and 800° C., and a time period in a range between 5 minutes and 30 minutes.

10. The method of claim 1, wherein the semiconductor layer of the fins is silicon, and the first epitaxially grown regions comprise SiGe or SiP.

11. A semiconductor device comprising:
   a semiconductor structure comprising:
      a substrate structure including a semiconductor substrate;
      a plurality of fins including a semiconductor layer extending into the semiconductor substrate, a first set of fins configured to form a plurality of first type devices, and a second set of fins configured to form a plurality of second type devices; and
      a gate structure disposed on the fins;
   a plurality of first epitaxially grown regions each disposed on one of the first set of fins, the first epitaxially grown regions being separated from each other; and a volume of a lower portion of each of the first epitaxially grown regions is greater than a volume of an upper portion of each of the first epitaxially grown regions, and the upper portion of each of the first epitaxially grown regions has a curved surface;

a plurality of second epitaxially grown regions each disposed on one of the second set of fins, the second epitaxially grown regions being separated from each other; and a volume of a lower portion of each of the second epitaxially grown regions is greater than a volume of an upper portion of each of the second epitaxially grown regions; and a first barrier layer having a first height on side surfaces of the first set of fins and a second height on side surfaces of the second set of fins, the first height being different from the second height.

12. The semiconductor device of claim 11, wherein the semiconductor layer of the fins is silicon, and the first epitaxially grown regions comprise SiGe or SiP.

13. The semiconductor device of claim 11, wherein the upper portion of each of the second epitaxially grown regions has a curved surface.

14. The semiconductor device of claim 11, wherein a height of the first epitaxially grown regions is different from a height of the second epitaxially grown regions.

15. The semiconductor device of claim 11, wherein each of the second epitaxially grown regions has a fingertip or strawberry cross-sectional shape.

16. The semiconductor device of claim 11, further comprising:
   a second barrier layer overlying the lower portion of each of the first epitaxially grown regions.

17. The semiconductor device of claim 11, wherein each of the first epitaxially grown regions has a fingertip or strawberry cross-sectional shape.

18. The semiconductor device of claim 11, wherein the first type devices are PMOS transistor devices, and the second type devices are NMOS transistor devices.

19. The semiconductor device of claim 11, further comprising an interlayer dielectric layer on the semiconductor structure.

20. The semiconductor device of claim 19, further comprising a contact electrode disposed in the interlayer dielectric layer and having electrical contact with the first and second epitaxially grown regions.

\* \* \* \* \*